US011764158B2

(12) United States Patent
Alur et al.

(10) Patent No.: US 11,764,158 B2
(45) Date of Patent: Sep. 19, 2023

(54) EMBEDDED MULTI-DIE INTERCONNECT BRIDGE PACKAGES WITH LITHOGRAPHICALLY FORMED BUMPS AND METHODS OF ASSEMBLING SAME

(71) Applicant: Intel Corporation, Santa Clara, CA (US)

(72) Inventors: Amruthavalli Pallavi Alur, Tempe, AZ (US); Sri Ranga Sai Boyapati, Chandler, AZ (US); Robert Alan May, Chandler, AZ (US); Islam A. Salama, Scottsdale, AZ (US); Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 327 days.

(21) Appl. No.: 17/306,807

(22) Filed: May 3, 2021

(65) Prior Publication Data
US 2021/0257303 A1 Aug. 19, 2021

Related U.S. Application Data

(60) Continuation of application No. 16/889,735, filed on Jun. 1, 2020, now Pat. No. 11,043,457, which is a
(Continued)

(51) Int. Cl.
*H01L 23/538* (2006.01)
*H01L 23/498* (2006.01)
(Continued)

(52) U.S. Cl.
CPC ........ *H01L 23/5381* (2013.01); *H01L 21/486* (2013.01); *H01L 21/4853* (2013.01);
(Continued)

(58) Field of Classification Search
CPC ........... H01L 21/76989; H01L 21/4853; H01L 21/4857; H01L 21/486; H01L 21/6835;
(Continued)

(56) References Cited

U.S. PATENT DOCUMENTS 9,136,236 B2 9/2015 Startston
9,437,569 B2 9/2016 Teh
(Continued)

FOREIGN PATENT DOCUMENTS

WO WO-2017111957 6/2017

OTHER PUBLICATIONS

Extended European Search Report for European Patent Application No. 18207616.6, dated Mar. 19, 2019, 8 Pgs.
(Continued)

*Primary Examiner* — Kyoung Lee
*Assistant Examiner* — Christina A Sylvia
(74) *Attorney, Agent, or Firm* — Schwabe, Williamson & Wyatt P.C.

(57) ABSTRACT

An embedded multi-die interconnect bridge apparatus and method includes photolithographically formed interconnects coupled to laser-drilled interconnects. Several structures in the embedded multi-die interconnect bridge apparatus exhibit characteristic planarization during fabrication and assembly.

20 Claims, 8 Drawing Sheets

Related U.S. Application Data division of application No. 16/182,277, filed on Nov. 6, 2018, now Pat. No. 10,707,168, which is a continuation of application No. 15/853,330, filed on Dec. 22, 2017, now Pat. No. 10,163,798.

(51) Int. Cl.

| | |
|---|---|
| *H01L 23/00* | (2006.01) |
| *H01L 25/065* | (2023.01) |
| *H01L 21/48* | (2006.01) |
| *H01L 25/00* | (2006.01) |
| *H01L 25/18* | (2023.01) |
| *H01L 23/31* | (2006.01) |
| *H01L 21/66* | (2006.01) |
| *H01L 21/683* | (2006.01) |
| *H01L 25/11* | (2006.01) |
| *H01L 23/492* | (2006.01) |

(52) U.S. Cl.
CPC ...... *H01L 21/4857* (2013.01); *H01L 23/3128* (2013.01); *H01L 23/49816* (2013.01); *H01L 23/5385* (2013.01); *H01L 23/5386* (2013.01); *H01L 24/16* (2013.01); *H01L 24/81* (2013.01); *H01L 25/0655* (2013.01); *H01L 25/18* (2013.01); *H01L 25/50* (2013.01); *H01L 21/6835* (2013.01); *H01L 22/14* (2013.01); *H01L 23/492* (2013.01); *H01L 23/5383* (2013.01); *H01L 24/14* (2013.01); *H01L 24/17* (2013.01); *H01L 25/115* (2013.01); *H01L 25/117* (2013.01); *H01L 2221/68345* (2013.01); *H01L 2221/68359* (2013.01); *H01L 2224/0401* (2013.01); *H01L 2224/1403* (2013.01); *H01L 2224/16225* (2013.01); *H01L 2224/16227* (2013.01); *H01L 2224/16238* (2013.01); *H01L 2224/1703* (2013.01); *H01L 2224/17106* (2013.01); *H01L 2224/18* (2013.01); *H01L 2224/81191* (2013.01); *H01L 2224/81203* (2013.01); *H01L 2224/81815* (2013.01); *H01L 2924/1431* (2013.01); *H01L 2924/1432* (2013.01); *H01L 2924/1436* (2013.01); *H01L 2924/15153* (2013.01); *H01L 2924/15311* (2013.01); *H01L 2924/15321* (2013.01)

(58) Field of Classification Search
CPC . H01L 22/14; H01L 23/5381; H01L 23/5384; H01L 23/492; H01L 23/5383; H01L 23/3128; H01L 23/49816; H01L 23/5385; H01L 23/5386; H01L 24/16; H01L 24/81; H01L 24/17; H01L 24/14; H01L 25/0655; H01L 25/18; H01L 25/50; H01L 25/115; H01L 25/17; H01L 2221/68345; H01L 2221/68359; H01L 2224/0401; H01L 2224/1403; H01L 2224/16225; H01L 2224/16227; H01L 2224/16238; H01L 2224/1703; H01L 2224/17106; H01L 2224/18; H01L 2224/81191; H01L 2224/81203; H01L 2224/81815; H01L 2224/13199; H01L 2224/81411; H01L 2224/81455; H01L 2224/81801; H01L 2924/1431; H01L 2924/1432; H01L 2924/1436; H01L 2924/15153; H01L 2924/15311; H01L 2924/1434; H01L 2924/15321

See application file for complete search history.

(56) References Cited

U.S. PATENT DOCUMENTS

| | | | |
|---|---|---|---|
| 9,443,824 B1 | 9/2016 | We et al. | |
| 10,163,798 B1 | 12/2018 | Alur et al. | |
| 2009/0244874 A1* | 10/2009 | Mahajan | H05K 1/142 |
| | | | 257/E21.499 |
| 2012/0139116 A1 | 6/2012 | Manusharow et al. | |
| 2014/0117552 A1 | 5/2014 | Qian et al. | |
| 2014/0191379 A1 | 7/2014 | Zhang | |
| 2014/0264791 A1 | 9/2014 | Manusharow et al. | |
| 2014/0332966 A1* | 11/2014 | Xiu | H01L 23/293 |
| | | | 257/773 |
| 2014/0353827 A1 | 12/2014 | Liu et al. | |
| 2015/0001717 A1 | 1/2015 | Karhade et al. | |
| 2015/0001733 A1 | 1/2015 | Karhade et al. | |
| 2015/0048515 A1 | 2/2015 | Zhang et al. | |
| 2015/0116965 A1 | 4/2015 | Kim et al. | |
| 2015/0279817 A1 | 10/2015 | Zhang et al. | |
| 2016/0085899 A1 | 3/2016 | Qian et al. | |
| 2016/0095219 A1 | 3/2016 | Sakamoto et al. | |
| 2016/0133571 A1 | 5/2016 | Lee et al. | |
| 2016/0172299 A1 | 6/2016 | Noveski | |
| 2016/0276235 A1 | 9/2016 | Chen | |
| 2016/0329284 A1 | 11/2016 | We | |
| 2016/0343692 A1 | 11/2016 | Lin | |
| 2017/0170121 A1* | 6/2017 | Haba | H01L 23/5383 |
| 2018/0005945 A1 | 1/2018 | Pietambaram et al. | |
| 2018/0040548 A1 | 2/2018 | Kim et al. | |
| 2018/0102311 A1* | 4/2018 | Shih | H01L 23/49827 |
| 2018/0174972 A1 | 6/2018 | Weng et al. | |
| 2018/0182699 A1 | 6/2018 | Lai et al. | |
| 2018/0182707 A1 | 6/2018 | Elsherbini et al. | |
| 2018/0269186 A1 | 9/2018 | Kang | |
| 2018/0366436 A1 | 12/2018 | Wang | |
| 2019/0304914 A1 | 10/2019 | Koh | |
| 2019/0333861 A1 | 10/2019 | Pietambaram et al. | |

OTHER PUBLICATIONS

Notice of Allowance for U.S. Appl. No. 15/853,330 dated Aug. 14, 2018, 10 pgs.

Office Action for European Patent Application No. 18207616.6, dated Nov. 8, 2021 9 pgs.

* cited by examiner

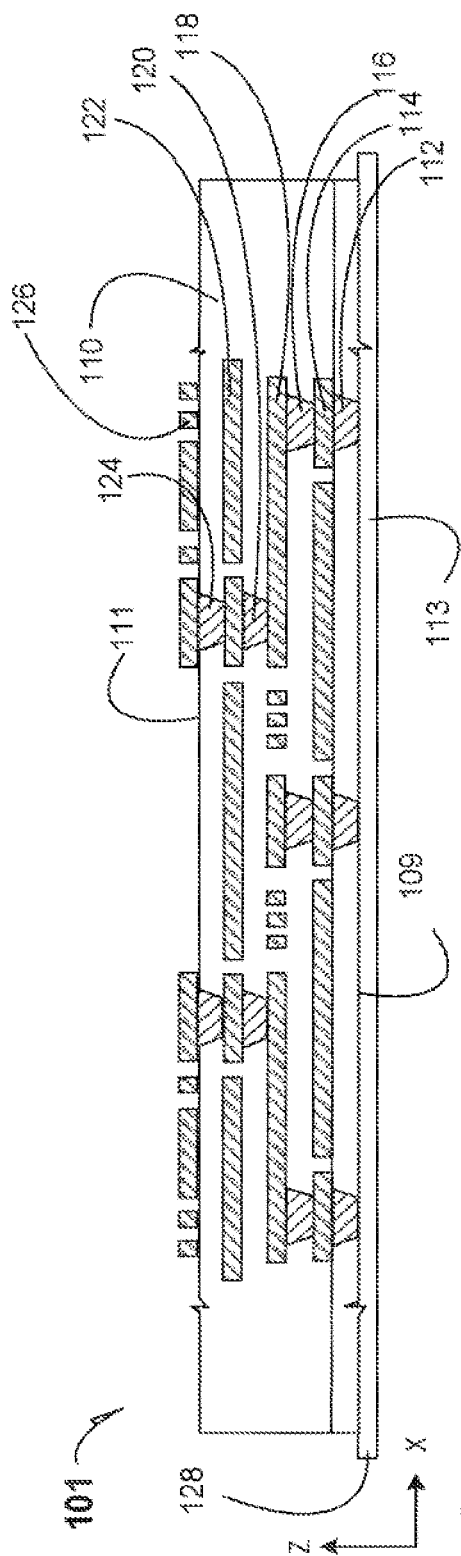
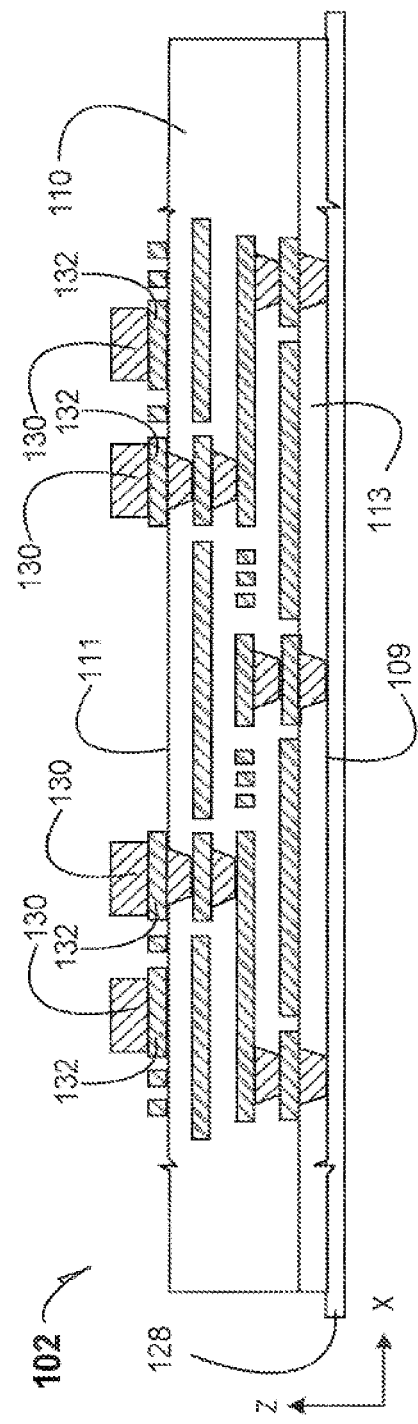

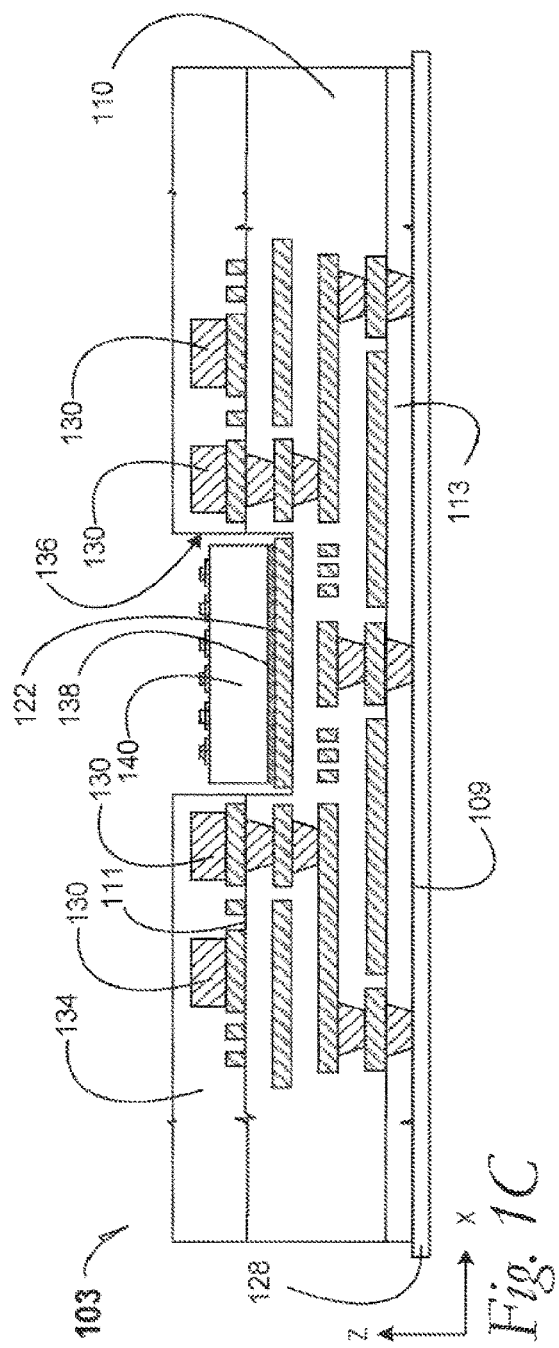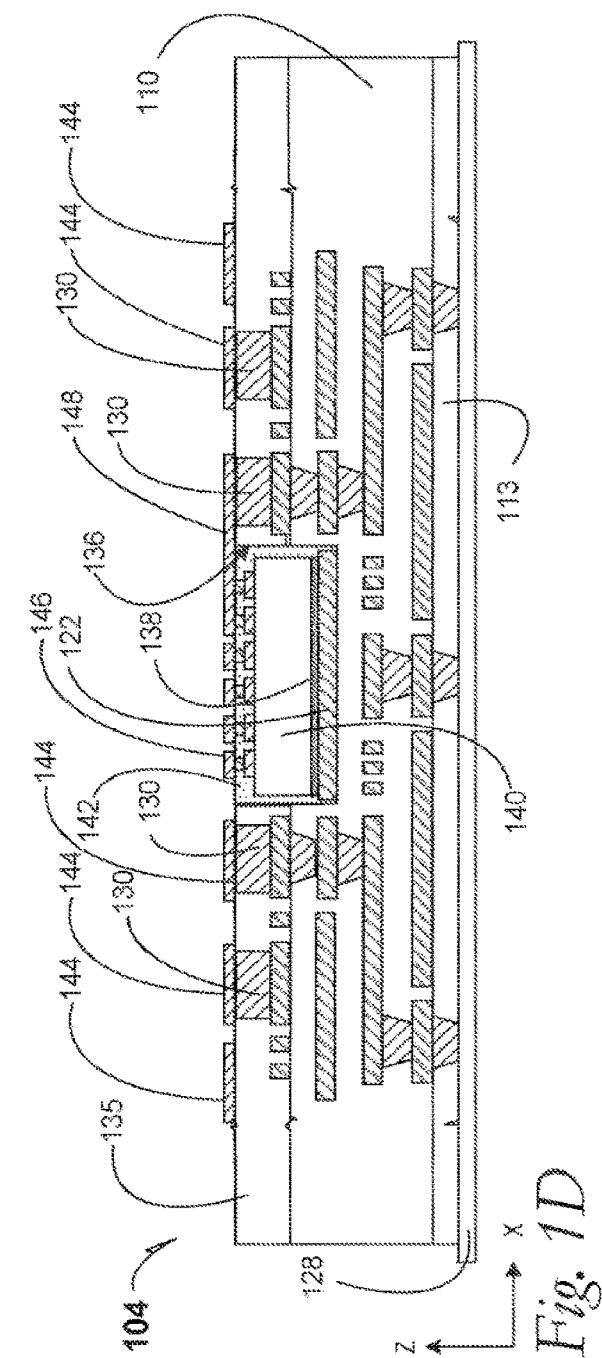

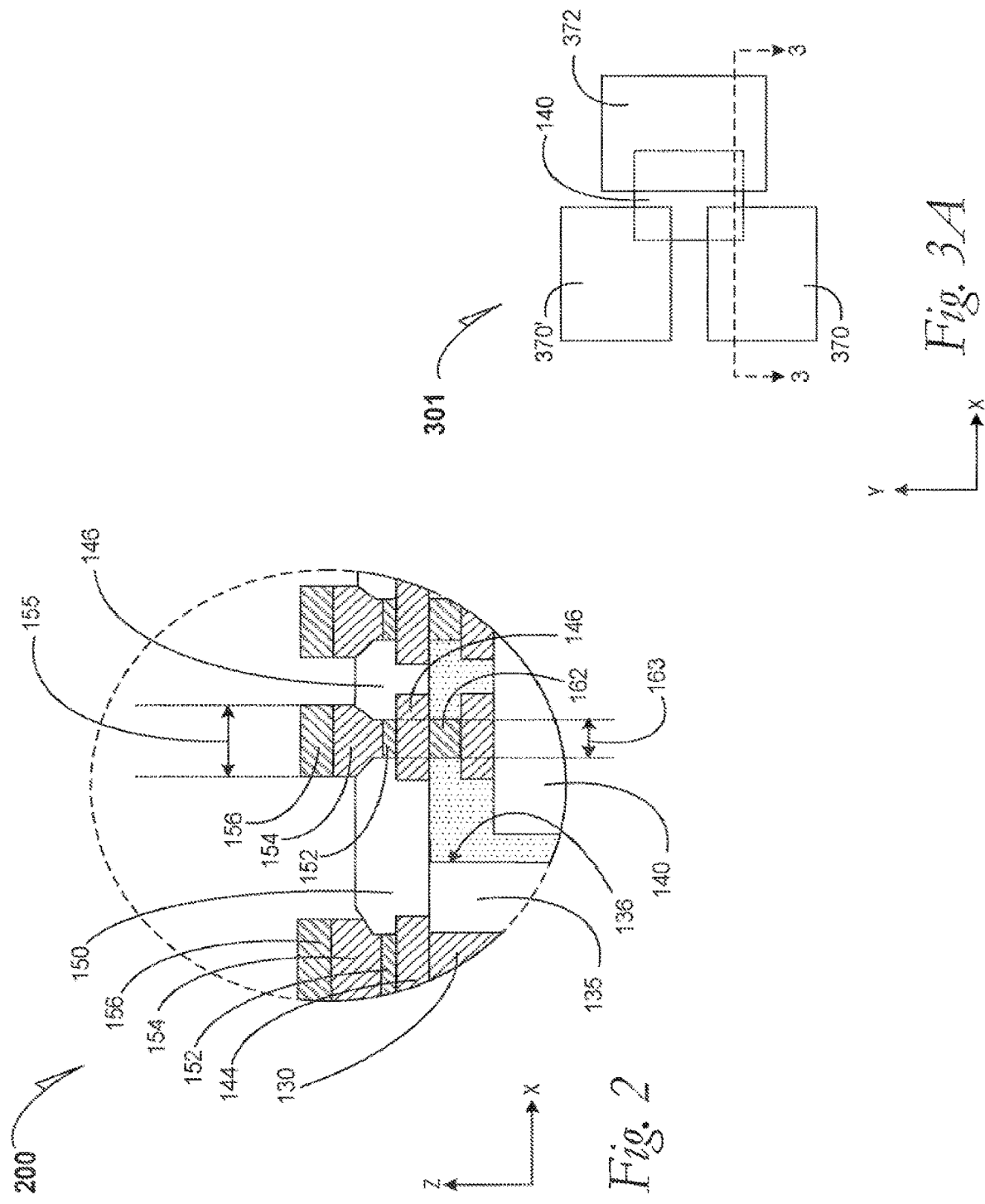

EMBEDDED MULTI-DIE INTERCONNECT BRIDGE PACKAGES WITH LITHOGRAPHICALLY FORMED BUMPS AND METHODS OF ASSEMBLING SAME

PRIORITY APPLICATION

This application is a continuation of U.S. patent application Ser. No. 16/889,735, filed Jun. 1, 2020, which is a divisional of U.S. patent application Ser. No. 16/182,277, filed Nov. 6, 2018, now U.S. Pat. No. 10,707,168, issued Jul. 7, 2020, which is a continuation of U.S. application Ser. No. 15/853,330, filed Dec. 22, 2017, now U.S. Pat. No. 10,163,798, issued Dec. 25, 2018, which are incorporated herein by reference in their entirety.

FIELD

This disclosure relates to embedded multi-die interconnect bridge packages that include lithographically formed bumps.

BACKGROUND

Semiconductive device miniaturization during packaging has bump-pitch scaling challenges to allow close-pitch electrical bumps to be located on semiconductor device package surfaces.

BRIEF DESCRIPTION OF THE DRAWINGS

Disclosed embodiments are illustrated by way of example, and not by way of limitation, in the figures of the accompanying drawings, where like reference numerals may refer to similar elements, in which:

FIG. 1A is a cross-section elevation of a semiconductor package substrate during fabrication according to an embodiment;

FIG. 1B is a cross-section elevation of the precursor package substrate depicted in FIG. 1A after further processing according to an embodiment;

FIG. 1C is a cross-section elevation of the precursor package substrate depicted in FIG. 1B after further processing according to an embodiment;

FIG. 1D is cross-section elevation of the precursor package substrate depicted in FIG. 1C after further processing according to an embodiment;

FIG. 2 is a detail section taken from FIG. 1F according to an embodiment;

FIG. 3A is a top view of a of a portion of the EMIB-inclusive semiconductor apparatus depicted in FIG. 3 according to an embodiment;

DETAILED DESCRIPTION

Figure 1E:
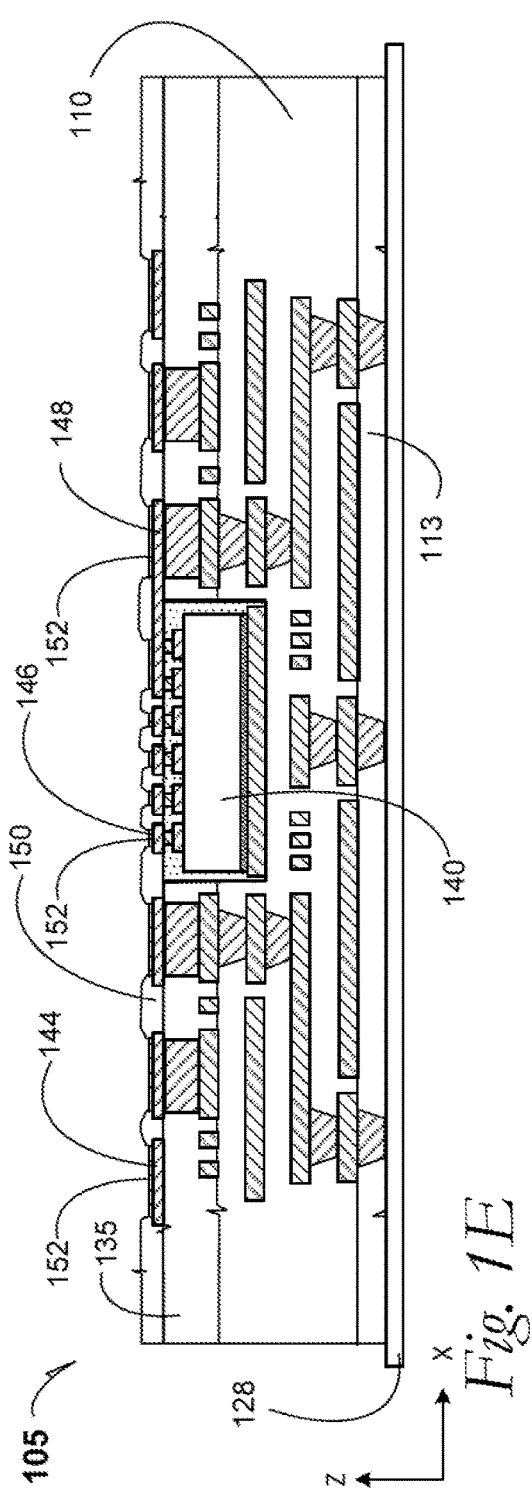
FIG. 1E is a cross-section elevation of the precursor package substrate and bridge die after further processing according to an embodiment.

Multi-die semiconductor device packages are assembled and tested through fabrication of a good substrate (KGS), along with known-good silicon bridge (KGB) to achieve high-yield embedded multi-die interconnect bridge (EMIB) semiconductive packaging apparatus.

Embodiments achieve bump-pitch scaling below 40 micrometer (µm), Accordingly, embedded multiple-die interconnect embodiments may be used for several applications such as for modular die-fabric interconnect (MDFIs).

Bump-thickness variation is controlled by planarizing both package substrate and silicon bridge bumps after embedding of bridge die in a cavity. Similarly, package-substrate thickness and shrinkage variations are controlled by assembling onto rigid and substantially flat carriers.

FIG. 1A is a cross-section elevation of a semiconductor package substrate 101 during fabrication according to an embodiment. A precursor package substrate 110 includes several layers. The precursor package substrate 110 includes a back surface 109 and a precursor top surface 111. Each layer in the precursor package substrate 110 contains either metallization with interconnects or traces, or it contains dielectric build-up layers for insulation and structural integrity. The metallization layers include layers of interconnects 112, 116, 120, and 124 and layers of traces 114, 118, 122 and 126.

In an embodiment, with the four trace layers and the four interconnect layers, the precursor package substrate 110 may be referred to as a low-layer count package substrate 110. The several build-up layers are not all specifically identified within the precursor package substrate 110 as they may be formed incidental to the several layers of interconnects and traces.

In an embodiment, the precursor package substrate 110 is assembled on a rigid carrier 128 such as polished glass or polished stainless steel. The rigid carrier 128 has both a rigidity and flatness that is useful to constrain film thickness variations and material shrinkage variations that are low for the design-rule geometries that include about 30 µm bump pitch and lower.

In an embodiment, the interconnects 112 are plated onto the rigid carrier 128 through a first build-up layer 113 that may have first been laser drilled to form a tapered or frusto-conical recess into which the interconnects 112 are filled. In an embodiment, a low-loss (low electrical loss) material is used for the ILDs such as a material with glass-fiber reinforcing to impart a useful stiffness to a silicon bridge package substrate.

Forming of the interconnects is carried out by plating processes such as semi-additive plating (SAP) of electronics-grade copper (Cu) to form, e.g. the tapered interconnects 112. In an embodiment, the interconnects 112, 116, 120 and 124 are also referred to as tapered vias.

FIG. 1B is a cross-section elevation 102 of the precursor package substrate 110 depicted in FIG. 1A after further processing according to an embodiment. A plurality of pillars 130 (four occurrences illustrated) is formed onto bond pads 132 that are seated on the precursor package top surface 111. The pillars 130 may also be referred to as package pillars 130. Whereas the several interconnects 112, 116, 120 and 124 (enumerated in FIG. 1A) have substantially frusto-conical (tapered in cross section) shape due to laser drilling of the contact corridors into which the several interconnects are formed, the plurality of pillars 130 have a substantial right solid-cylinder shape due to forming the plurality of pillars 130 using photolithography.

In an embodiment, the several interconnects 112, 116, 120 and 124 are formed by laser drilling into the ILDs that separate the interconnects and traces in the precursor package substrate 110. The shape and quality of the interconnect recess into which the several interconnects 112, 116, 120 and 124 are formed, can be described as characteristic of laser drilling. One characteristic of laser drilling is the tapered shape. One characteristic of laser drilling is an ablative chemical quality of the tapered walls of the build-up material, compared to anywhere else in the bulk of an build-up layer where no ablation has occurred.

Formation of the plurality of pillars 130 is done by patterning a photolithographic mask (not pictured), and depositing the pillars 130 such as by electroplating, followed by removing the mask. The plurality of pillars is plated using such processes as semi-additive plating (SAP) in an embodiment. The shape and quality of the pillars 130, can be described as characteristic of photolithographic formation. On characteristic of photolithographic formation includes the substantially right-angle of the solid-cylinder pillars 130. One characteristic of photolithographic formation includes photomicroscopically examining the vertical aspects of the pillars 130 and observing negative-image profiles, that a patterned mask imprints on the pillar walls. In any event within a given known-good substrate that includes a recess to seat a known good bridge die, the right solid-cylinder shape of the pillars 130 is distinguishable from the solid frusto-conical shapes of the several interconnects 112, 116, 120 and 124, that are formed by laser drilling into the ILDs.

FIG. 1C is a cross-section elevation 103 of the precursor package substrate 110 depicted in FIG. 1B after further processing according to an embodiment. A lamination layer 134 has been formed over the plurality of pillars 130 and on the precursor top surface 111, and a bridge recess 136 has been drilled into both the lamination layer 134 and through the precursor top surface 111 until the trace 122 is uncovered. An adhesive 138 is deposited in the bridge recess 136 and a silicon bridge 140 (also referred to as a bridge die 140) is seated within the bridge recess 136 on the adhesive 138. Although a trace 122 at this level of the precursor package substrate 110 is depicted as the seat for the silicon bridge 140, the bridge recess 136 bottoms out above (positive-Z direction) this level according to an embodiment.

Before assembly of the bridge die 140 into the bridge recess 136, the bridge die 140 and the precursor package substrate 110 are tested, such that a known-good bridge (KGB) 140 is assembled to a known-good-substrate (KGS) 110. Accordingly, yield for an embedded bridge is achieved to useful levels.

FIG. 1D is cross-section elevation 104 of the precursor package substrate 110 depicted in FIG. 1C after further processing according to an embodiment. An encapsulation material 142 has been filled into the bridge recess 136 and the lamination layer 134 and the encapsulation material 142 have been planarized to a form respective planarized laminations 135 and 142. By achieving the planarized lamination layer 135 and the encapsulation material 142, a useful package flatness is achieved for further processing.

In an embodiment, package bond pads 144, bridge-die bond pads 146 and package-to-bridge traces 148 (only one occurrence illustrated) are plated onto the planarized laminations 135 and 142. The package bond pads 144, the bridge-die bond pads 146 and the package-to-bridge die traces 148 are plated using such processes as semi-additive plating (SAP) in an embodiment.

FIG. 1E is a cross-section elevation 105 of the precursor package substrate 110 and bridge die 140 after further processing according to an embodiment. A patterned photoresist layer 150 has been formed over the package bond pads 144, bridge-die bond pads 146 and package-to-bridge traces 148. In an embodiment, the photoresist layer 150 has been patterned to partially re-expose the package bond pads 144, bridge-die bond pads 146 and package-to-bridge traces 148. In an embodiment, a protective contact film 152 such as a nickel-palladium-gold (NiPdAu) alloy 152 is plated onto exposed portions of the package bond pads 144, bridge-die bond pads 146 and package-to-bridge traces 148. In an embodiment, the protective contact film 152 provides useful adhesion, low electrical resistivity, and protection from a tin or nickel-tin (Sn or NiSn) bond layer that is to be plated later.

Figure 1F:
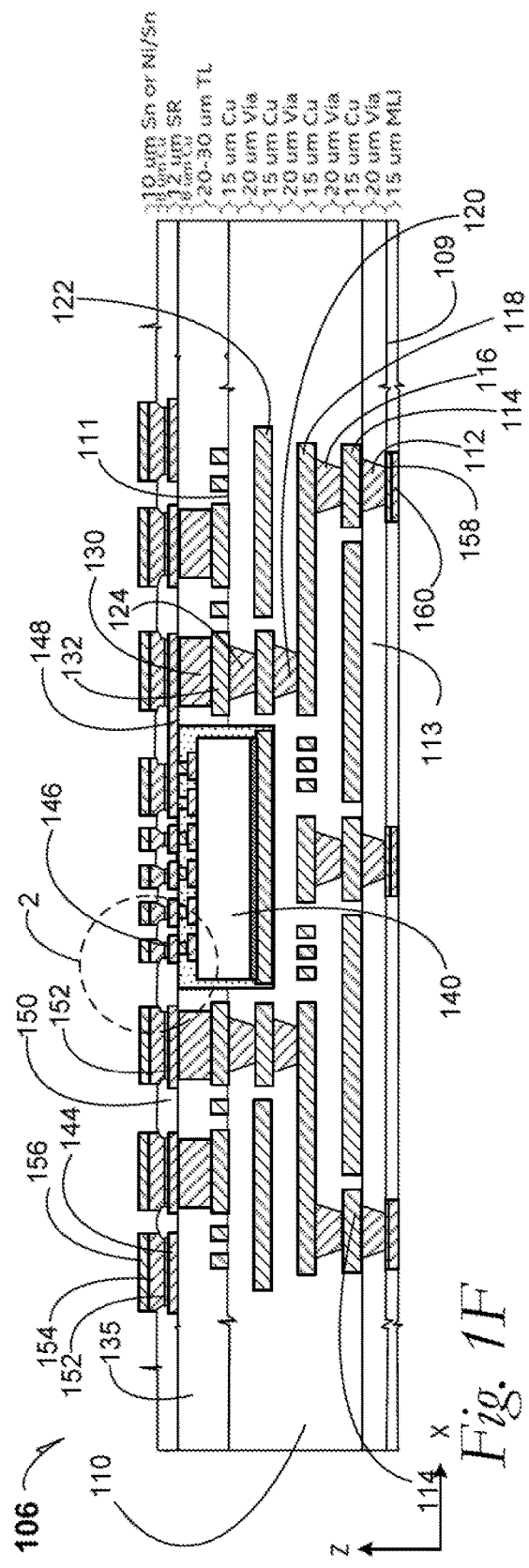
FIG. 1F is a cross-section elevation of an embedded multiple-die interconnect bridge apparatus after further processing of the precursor package substrate and bridge die depicted in FIG. 1E according to an embodiment.

FIG. 1F is a cross-section elevation 106 of an embedded multiple-die interconnect bridge package (EMIB) package 106 after further processing of the precursor package substrate 110 and bridge die 140 depicted in FIG. 1E according to an embodiment. Plating onto the protective contact film 152 has been done to include a copper flash layer 154 and on the copper flash layer 154 the Sn or NiSn bond layer 156 described herein.

After photolithographic formation of the structures above the top surface 111 of the precursor package substrate 110, a protective carrier (not pictured) is seated on the exposed structures above the top surface 111. The rigid carrier 128 (see, e.g. FIG. 1E) is removed and a mid-level interconnect (MLI) 158 and 160 is plated onto the interconnects 112 that are exposed through the back surface 109 of the first ILD layer 113.

FIG. 2 is a detail section 200 taken from a section circle 2 in FIG. 1F according to an embodiment. The bridge die 140 includes a bridge-die pillar 162 that is photolithographically formed before the bridge die 140 is seated into the bridge recess 136. In an embodiment, the bridge-die pillar 162 has a diameter 163 (X-direction) of about 10 µm. In an embodiment, formation of the photoresist layer 150 allows for a bridge-die bond layer 156 to have a diameter 155 of about 20 µm.

In an embodiment, the protective contact film 152 that is coupled between the bridge-die pillar 158 and the bond layer 156 is also patterned and formed with a diameter of about 10 µm. In an embodiment, the bridge-die bond pads 146 have a diameter of about 25 µm.

In an embodiment, the bond layer 156 that is plated above the pillar 130 has a diameter of about 40 µm.

Reference is made to FIG. 1F. Via structures formed below (negative-Z direction) the level of the plurality of pillars 130 have a shape that is characteristic of laser-drilling and SAP formation, while the pillars 130 are formed by litho processing. The micro-vias 120,124 are formed by laser drilling, as indicated by the tapered shape. Via structures above the level of the upper surface 111, including the plurality of pillars 130 and structures above (positive-Z direction) the pillars have a shape that characteristic of photolithographically patterned vias.

Figure 3:
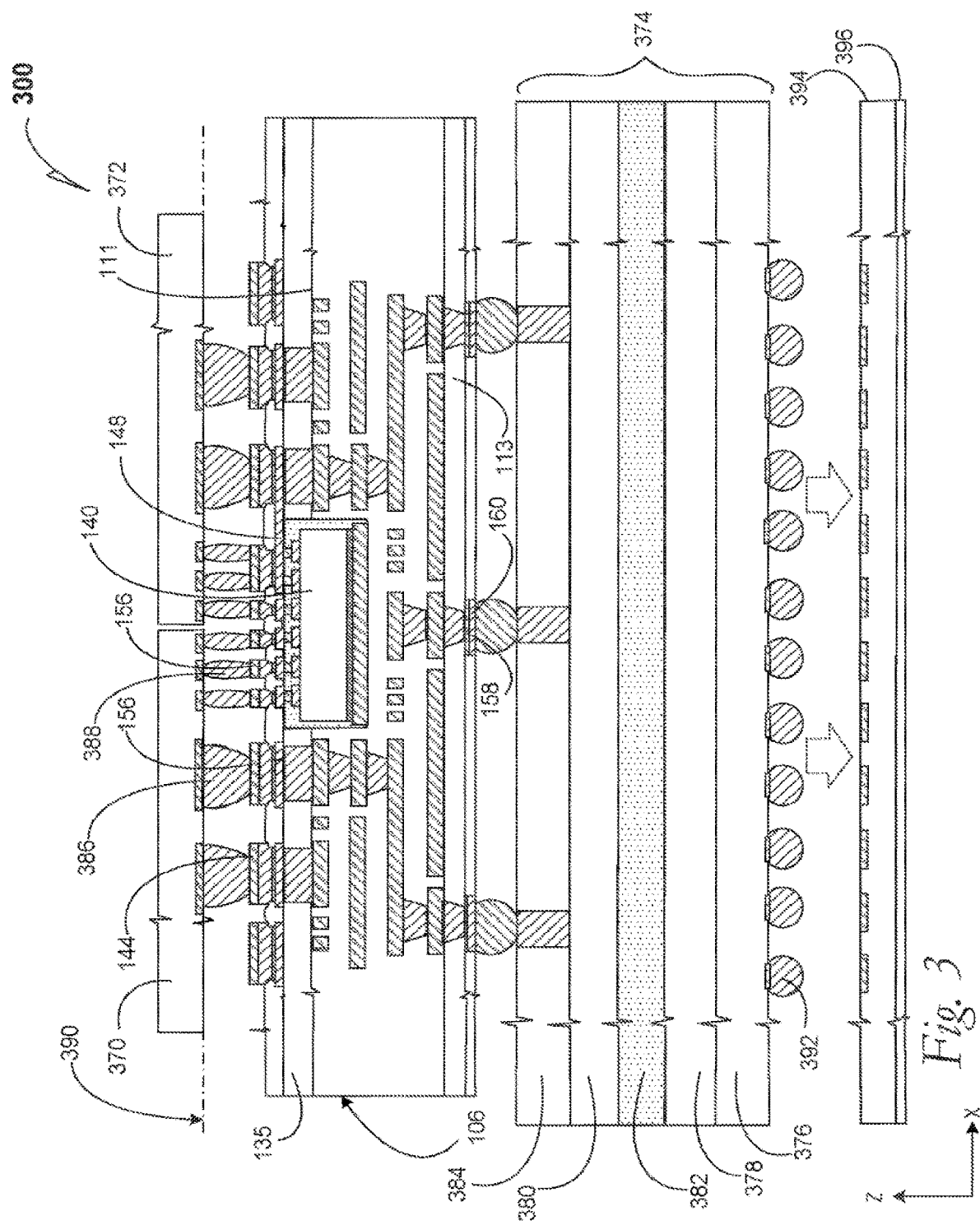
FIG. 3 is a cross-section elevation of an embedded multi-die interconnect bridge-inclusive semiconductor apparatus according to an embodiment.

FIG. 3 is a cross-section elevation of an EMIB-inclusive semiconductor apparatus 300 according to an embodiment. Selected reference numbers from FIGS. 1A through 1F are included.

In an embodiment, the embedded multiple-die interconnect bridge package (EMIB) apparatus 106 from FIG. 1F, includes a known-good substrate 110 (see FIG. 1F) and a known-good bridge 140. The EMIB apparatus 106 is seated on an interposer 374. The interposer 374 may include routing layers and second level-interconnect (SLI) 392, buildup layers 378 and 380, a core 382 and a mid-level interconnect (MLI) layer 384.

In an embodiment, a first die 370 and a subsequent die 372 are seated on the EMIB apparatus 106 such that the bridge die 140 provides a communication bridge between these respective dice 370 and 372, and communication between either of the dice 370 and 372 may be directed through the interposer 374.

In an embodiment, a larger-pitch series of electrical bumps (one instance numbered 386) contacts the EMIB apparatus 106 in a configuration that allows for such contacts to fan out upon the EMIB apparatus 106.

In an embodiment, a smaller-pitch series of electrical bumps (one instance numbered 388) contacts the known-good bridge die 140 and the respective first and subsequent dice 370 and 372. In an embodiment, the pitch of the smaller-pitch series of electrical bumps is about 30 µm between adjacent electrical bumps 388, center-to-center.

In an embodiment before seating the first die 370 and a subsequent die 372, planarizing is done on the several electrical bumps 386 and 388. In an embodiment, the several electrical bumps 386 and 388 remain in a patterned mask (not illustrated), and planarizing is done to a re-planarization level 390. Accordingly, the known-good substrate-containing known-good die EMIB apparatus 106 depicted in FIG. 1F has been planarized at the upper surface 111, and at the level that supports the package bond pads 144, the bridge-die bond pads 146 and the package-to-bridge die traces 148. Similarly and accordingly, re-planarizing of the EMIB-inclusive semiconductor apparatus 300 includes planarizing the several electrical bumps 386 and 388 at the re-planarization level 390.

In an embodiment, the electrical bumps 386 and 388 are reflowed from solder paste, planarized to the re-planarization level 390, and then the dice 370 and 372 are bonded to the several electrical bumps 386 and 388 by thermo-compression bonding (TCB). TCB is carried out by adding a net heat flow to the planarized electrical bumps 386 and 388, while also adding a net increased pressure on the bumps.

In an embodiment, alignment within EMIB-inclusive semiconductor apparatus 300 includes plus-or-minus 5 µm for the smaller-bump pitch for the electrical bumps 386, and plus-or-minus 4.5 µm for Z-direction die bonding variance between the bridge die 140 and any of the respective dice 370 and 372.

In an embodiment, the first die 370 is processor die such as that made by Intel Corporation of Santa Clara, Calif. In an embodiment, the first die 370 is doubled (the doubled die (see the fourth die 370' in FIG. 3A) is disposed in the same X-Z space as the first die, but at a different Y-direction, into or out of the plane of the drawing). With the doubled or fourth die 370', the subsequent die 372 die is a graphics processor, and the first die 370 and the fourth die 370' are logic processors, and the graphics processor 372 are all coupled to the bridge die 140.

As illustrated, wherein each tapered via 112, 116, 120 and 132 ordinally contacts a respective trace 114, 118, 122 and 132. In other words, the first tapered via 112, contact the first trace 114, the second tapered via 116 contacts the second trace 118, the third tapered via 120 contacts the third trace 122, and the fourth tapered via 124 contacts the fourth trace 132. The fourth trace 132 is disposed at the planarized lamination, and the fourth trace 132 contacts both a package pillar 130 the fourth tapered via 124. In other words, ordinally sequenced tapered vias 112, 116, 120 and 132, contact respective ordinally sequenced traces 114, 118, 122 and 132.

In an embodiment after forming electrical bumps 392 on the interposer 374, the interposer 374 is seated on a board 394 such as a motherboard 394. In an embodiment, the board 394 includes an external shell 396 that provides both physical and electrical insulation for devices within the external shell 396.

FIG. 3A is a top plan 301 of a portion of the EMIB-inclusive semiconductor apparatus 300 depicted in FIG. 3 according to an embodiment. Selected reference numbers from FIG. 3 is included.

In an embodiment, the first die 370 and the fourth die 370' are processor dice such as that made by Intel Corporation of Santa Clara, Calif. In an embodiment, the second die is a graphics processor, and the dice 370, 370' and 372 are coupled to the bridge die 140. Accordingly, the first die 370, the subsequent die 372 and the bridge die 140 are complemented by the die 370' as a fourth die 370'. In an embodiment, the first die 370 and the fourth die 370' are logic processors and the subsequent die 372 is a graphics processor.

Figure 4:
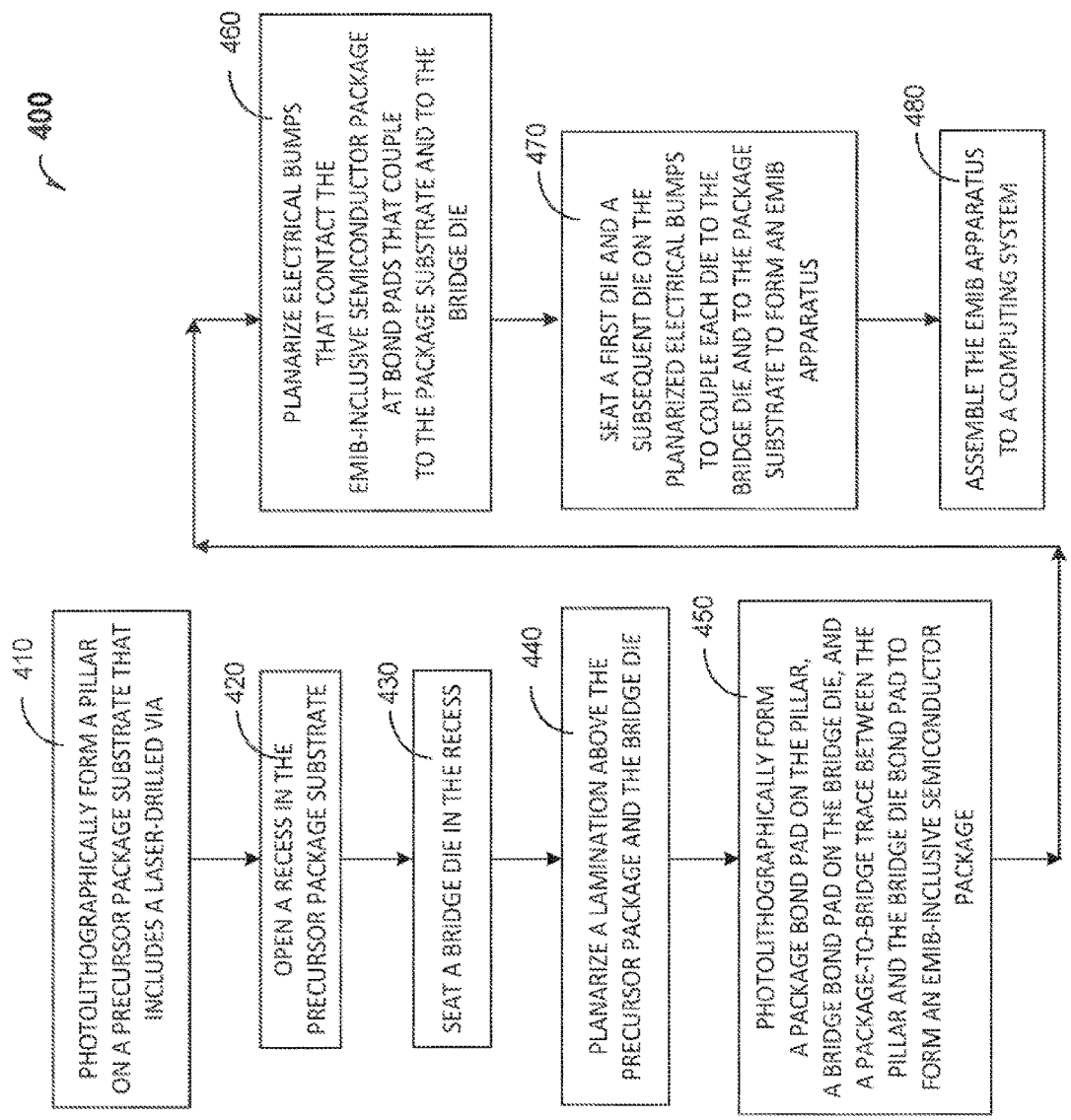
FIG. 4 is a process flow diagram according to several embodiments.

FIG. 4 is a process flow diagram 400 according to several embodiments.

At 410, the process includes photolithographically forming a pillar on a precursor package substrate that includes a laser-drilled via.

At 420, the process includes opening a recess in the precursor package substrate.

At 430, the process includes seating a bridge die in the recess.

At 440, the process includes planarizing a lamination above the precursor package substrate and the bridge die.

At 450, the process includes photolithographically forming a package bond pad on the pillar, a bridge bond pad on the bridge die, and a package-to-bridge trace between the pillar and the bridge-die bond pad to form an EMIB-inclusive semiconductor package.

At 460, the process includes planarizing electrical bumps that contact the EMIB-inclusive semiconductor package at bond pads that couple to the package substrate and to the bridge die.

At 470, the process includes seating a first die and a subsequent die on the planarized electrical bumps to couple each die to the bridge die and to the package substrate to form an EMIB apparatus.

At 480, the process includes assembling the EMIB apparatus to a computing system.

Figure 5:
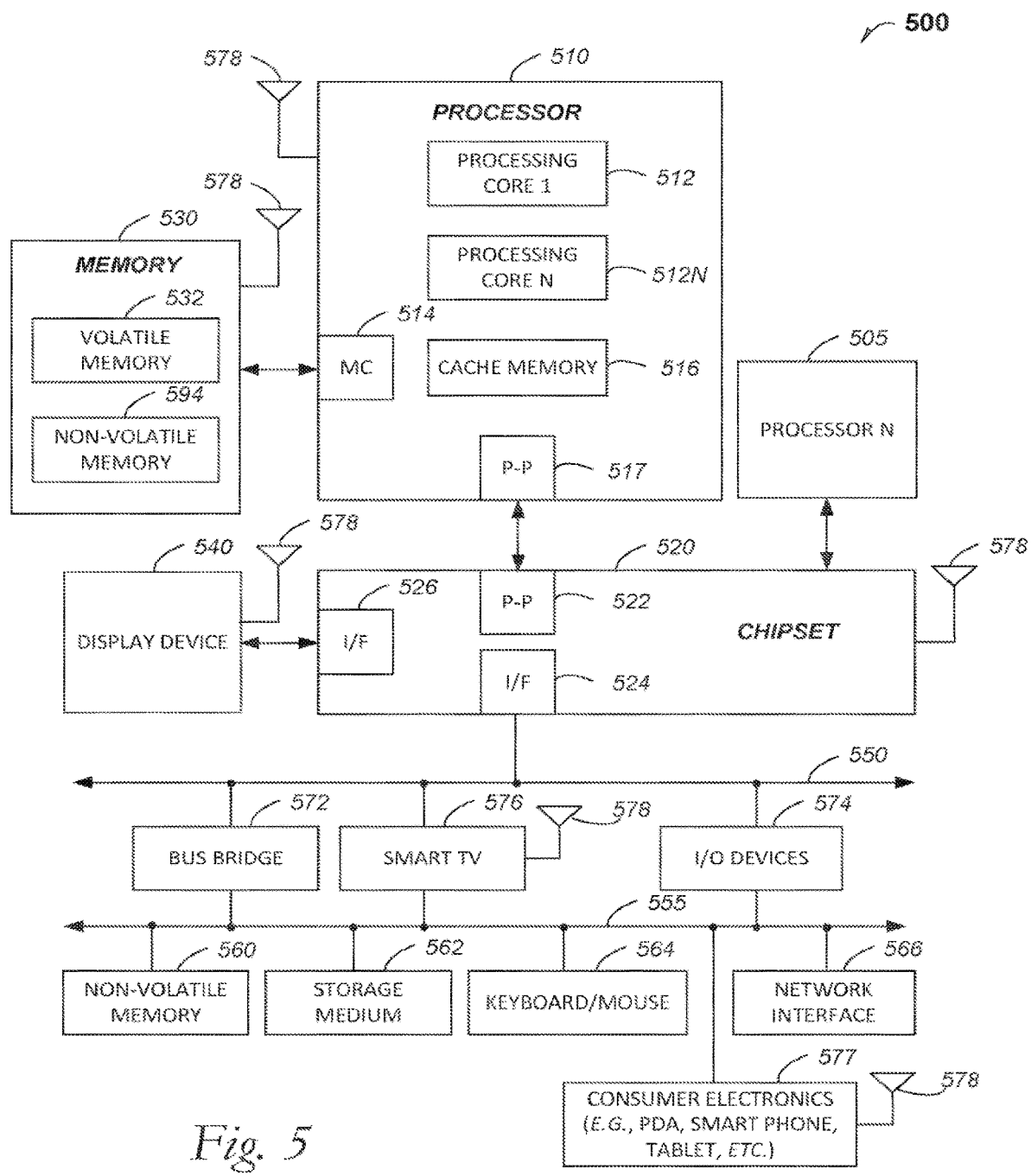
FIG. 5 is included to show an example of a higher-level device application for the disclosed embodiments.

FIG. 5 is included to show an example of a higher-level device application for the disclosed embodiments. The EMIB apparatus embodiments may be found in several parts of a computing system. In an embodiment, the EMIB apparatus part of a communications apparatus such as is affixed to a cellular communications tower. In an embodiment, a computing system 500 includes, but is not limited to, a desktop computer. In an embodiment, a system 500 includes, but is not limited to a laptop computer. In an embodiment, a system 500 includes, but is not limited to a netbook. In an embodiment, a system 500 includes, but is not limited to a tablet. In an embodiment, a system 500 includes, but is not limited to a notebook computer. In an embodiment, a system 500 includes, but is not limited to a personal digital assistant (PDA). In an embodiment, a system 500 includes, but is not limited to a server. In an embodiment, a system 500 includes, but is not limited to a workstation. In an embodiment, a system 500 includes, but is not limited to a cellular telephone. In an embodiment, a system 500 includes, but is not limited to a mobile computing device. In an embodiment, a system 500 includes, but is not limited to a smart phone. In an embodiment, a system 500 includes, but is not limited to an internet appliance. Other types of computing devices may be configured with the microelectronic device that includes multi-layer solder resist on a semiconductor device package substrate embodiments.

In an embodiment, the processor 510 has one or more processing cores 512 and 512N, where 512N represents the Nth processor core inside processor 510 where N is a positive integer. In an embodiment, the electronic device system 500 using an EMIB apparatus embodiment that includes multiple processors including 510 and 505, where the processor 505 has logic similar or identical to the logic of the processor 510. In an embodiment, the processing core 512 includes, but is not limited to, pre-fetch logic to fetch instructions, decode logic to decode the instructions, execution logic to execute instructions and the like. In an embodiment, the processor 510 has a cache memory 516 to cache at least one of instructions and data for the EMIB apparatus in the system 500. The cache memory 516 may be organized into a hierarchal structure including one or more levels of cache memory.

In an embodiment, the processor 510 includes a memory controller 514, which is operable to perform functions that enable the processor 510 to access and communicate with memory 530 that includes at least one of a volatile memory 532 and a non-volatile memory 534. In an embodiment, the processor 510 is coupled with memory 530 and chipset 520. In an embodiment, the chipset 520 is part of a system-in-package with an EMIB apparatus depicted in FIG. 1F. The processor 510 may also be coupled to a wireless antenna 578 to communicate with any device configured to at least one of transmit and receive wireless signals. In an embodiment, the wireless antenna interface 578 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 534 includes, but is not limited to, flash memory, phase change memory (PCM), read-only memory (ROM), electrically erasable programmable read-only memory (EEPROM), or any other type of non-volatile memory device.

The memory 530 stores information and instructions to be executed by the processor 510. In an embodiment, the memory 530 may also store temporary variables or other intermediate information while the processor 510 is executing instructions. In the illustrated embodiment, the chipset 520 connects with processor 510 via Point-to-Point (PtP or P-P) interfaces 517 and 522. Either of these PtP embodiments may be achieved using an EMIB apparatus embodiment as set forth in this disclosure. The chipset 520 enables the processor 510 to connect to other elements in an EMIB apparatus embodiment in a system 500. In an embodiment, interfaces 517 and 522 operate in accordance with a PtP communication protocol such as the Intel® QuickPath Interconnect (QPI) or the like. In other embodiments, a different interconnect may be used.

In an embodiment, the chipset 520 is operable to communicate with the processor 510, 505N, the display device 540, and other devices 572, 576, 574, 560, 562, 564, 566, 577, etc. The chipset 520 may also be coupled to a wireless antenna 578 to communicate with any device configured to at least do one of transmit and receive wireless signals.

The chipset 520 connects to the display device 540 via the interface 526. The display 540 may be, for example, a liquid crystal display (LCD), a plasma display, cathode ray tube (CRT) display, or any other form of visual display device. In an embodiment, the processor 510 and the chipset 520 are merged into an EMIB apparatus in a system. Additionally, the chipset 520 connects to one or more buses 550 and 555 that interconnect various elements 574, 560, 562, 564, and 566. Buses 550 and 555 may be interconnected together via a bus bridge 572 such as at least one EMIB apparatus on a semiconductor device package substrate apparatus embodiment. In an embodiment, the chipset 520, via interface 524, couples with a non-volatile memory 560, a mass storage device(s) 562, a keyboard/mouse 564, a network interface 566, smart TV 576, and the consumer electronics 577, etc.

In an embodiment, the mass storage device 562 includes, but is not limited to, a solid state drive, a hard disk drive, a universal serial bus flash memory drive, or any other form of computer data storage medium. In one embodiment, the network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the EMIB apparatus embodiment in a computing system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into the processor core 512.

Where useful, the computing system 500 may have a broadcasting structure interface such as for affixing the apparatus to a cellular tower.

Figure 6:
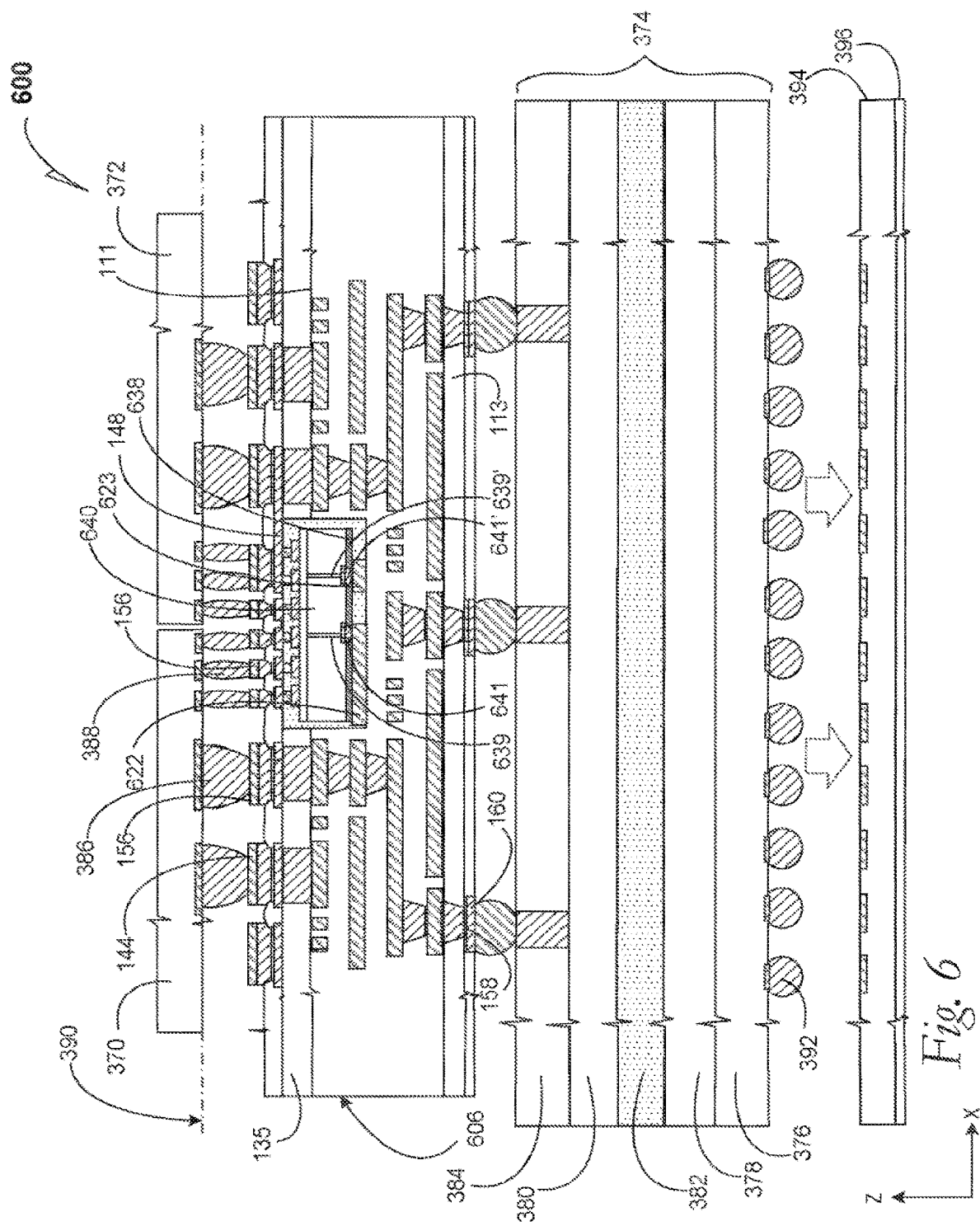
FIG. 6 is a cross-section elevation of an EMIB-inclusive semiconductor apparatus with through-silicon via access in a bridge die according to an embodiment.

FIG. 6 is a cross-section elevation of an EMIB-inclusive semiconductor apparatus 600 with through-silicon via (TSV) access in a bridge die 640 according to an embodiment. Selected reference numbers from FIGS. 1A through 1F and FIG. 3 are included. An EMIB package 606 is prepared according to several processing embodiments.

In an embodiment, the bridge die 640 includes at least one TSV 639, and an adhesive 638 is patterned to allow at least one backside bump 641 to contact a trace 622. In an embodiment, at least one TSV 639' contacts at least one backside bump 641' through the adhesive 638 to contact a bond pad 623 within the EMIB package 606.

Where direct contact from the bridge die 640 into the EMIB package 606 includes package-to-bridge traces 148, disclosed TSV embodiments 639 and 639' allow for direct contact through the bridge die 640 backside into the EMIB package 606.

Reference is made to FIG. 3A. In an embodiment at least one TSV (as depicted in FIG. 6) is located directly below the first die 370. In an embodiment, at least one TSV (as depicted in FIG. 6) is located directly below the subsequent die 372. In an embodiment, at least one TSV (as depicted in FIG. 6) is located directly below the fourth die 370'.

To illustrate the EMIB apparatus embodiments and methods disclosed herein, a non-limiting list of examples is provided herein:

Example 1 is a semiconductor package apparatus, comprising: a bridge die disposed in a recess of a semiconductor package substrate, wherein the semiconductor package substrate includes a filled via coupled to a package pillar; a lamination above the package pillar and the bridge die, wherein the bridge die includes a bridge-die bond pad; an electrical bump that is coupled to the package pillar and electrical bump that is coupled to the bridge-die bond pad; a first semiconductive device coupled to the electrical bump that is coupled to the package pillar; and a subsequent semiconductive device coupled to the electrical bump that is coupled to the bridge-die bond pad.

In Example 2, the subject matter of Example 1 optionally includes a package bond pad patterned on the lamination and contacting the package pillar; a bridge-die bond pad patterned on the lamination and contacting a bridge-die pillar; and a package-to-bridge trace patterned on the lamination and contacting a bridge-die pillar and a package pillar.

In Example 3, the subject matter of any one or more of Examples 1-2 optionally include a package bond pad patterned on the lamination and contacting the package pillar; a bridge-die bond pad patterned on the lamination and contacting a bridge-die pillar; a package-to-bridge trace patterned on the lamination and contacting a bridge-die pillar and a package pillar; and a protective contact film disposed on each of the package bond pad and the bridge-to-die bond pad and patterned through a patterned photoresist layer.

In Example 4, the subject matter of any one or more of Examples 1-3 optionally include a package bond pad patterned on the lamination and contacting the package pillar; a bridge-die bond pad patterned on the lamination and contacting a bridge-die pillar; and a package-to-bridge trace patterned on the lamination and contacting a bridge-die pillar and a package pillar, wherein the bridge die is seated on an adhesive, and wherein the package bond pad and the bridge-die bond pad exhibit planarization above the patterned photoresist.

In Example 5, the subject matter of any one or more of Examples 1-4 optionally include wherein the bridge die is seated on an adhesive, and wherein the package bond pad and the bridge-die bond pad exhibit planarization above the patterned photoresist.

In Example 6, the subject matter of any one or more of Examples 1-5 optionally include wherein the bridge die is seated on an adhesive, and wherein the package bond pad and the bridge-die bond pad exhibit planarization above the patterned photoresist, further including a mid-level interconnect on the back surface, wherein the mid-level interconnect contacts a tapered via within the semiconductor package substrate.

In Example 7, the subject matter of any one or more of Examples 1-6 optionally include wherein the semiconductor package substrate includes a back surface, further including: a mid-level interconnect on the back surface, wherein the mid-level interconnect contacts a tapered via within the semiconductor package substrate.

In Example 8, the subject matter of any one or more of Examples 1-7 optionally include wherein the semiconductor package substrate includes a back surface, further including: a mid-level interconnect on the back surface, wherein the mid-level interconnect contacts a tapered via; and an interposer coupled to the mid-level interconnect.

In Example 9, the subject matter of any one or more of Examples 1-8 optionally include wherein the semiconductor package substrate includes a back surface, further including: a mid-level interconnect on the back surface, wherein the mid-level interconnect contacts a tapered via; an interposer coupled to the mid-level interconnect; a ball-grid array on the interposer; and a board coupled to the ball-grid array.

In Example 10, the subject matter of any one or more of Examples 1-9 optionally include wherein the semiconductor package substrate includes a back surface, further including: a mid-level interconnect on the back surface, wherein the mid-level interconnect contacts a tapered via, and wherein the semiconductor package substrate includes a first tapered via, a second tapered via, a third tapered via and a fourth tapered via and a first trace, a second trace, a third trace and a fourth trace, wherein each tapered via ordinally contacts a trace, and wherein the fourth trace is disposed at the lamination, and wherein the fourth trace contacts the package pillar one of the fourth tapered via.

In Example 11, the subject matter of any one or more of Examples 1-10 optionally include a fourth die, wherein the first die, the subsequent die and the fourth die each is coupled to the bridge die.

In Example 12, the subject matter of any one or more of Examples 1-11 optionally include wherein the semiconductor package substrate includes four tapered vias that ordinally contact four respective ordinally sequenced traces, and wherein the fourth trace also contacts a package pillar.

Example 13 is a process of forming a semiconductor package apparatus, comprising: photolithographically forming a package pillar on a precursor package substrate, to couple the package pillar with a laser-drilled via; seating a bridge die in a recess in the precursor package substrate; forming a planarized lamination above the precursor package substrate and the bridge die; forming planarized electrical bumps that couple to the precursor package substrate and to the bridge die; and seating a first semiconductive device and a subsequent semiconductive device on the planarized electrical bumps, under conditions that the bridge die provides a communications bridge between the first and subsequent semiconductive dice.

In Example 14, the subject matter of Example 13 optionally includes wherein photolithographically forming the package pillar on the precursor package substrate includes forming the package pillar on a trace that contacts the package pillar with a laser-drilled via.

In Example 15, the subject matter of any one or more of Examples 13-14 optionally include filling the recess with a lamination after seating the bridge die, followed by forming the planarized lamination above the precursor package substrate and the bridge die.

In Example 16, the subject matter of any one or more of Examples 13-15 optionally include seating the precursor package substrate on a carrier; forming package bond pads and bridge-die bond pads on the planarized lamination; patterning a photoresist layer on the planarized lamination; patterning a bond layer through the photoresist to couple to the pillar and to the bridge-die; and forming solder-paste electrical bumps on the bond layers, followed by forming the planarized electrical bumps.

In Example 17, the subject matter of any one or more of Examples 13-16 optionally include bonding the first and subsequent dice on the planarized electrical bumps by using added heat and pressure.

Example 18 is a computing system, comprising: a bridge die disposed in a recess of a semiconductor package substrate, wherein the semiconductor package substrate includes filled via coupled to a package pillar; a lamination above the package pillar and the bridge die, wherein the bridge die includes a bridge-die bond pad; an electrical bump coupled to the package pillar and an electrical bump that is coupled to the bridge-die bond pad; a first semiconductive device coupled to the electrical bump coupled to the package pillar; a subsequent semiconductive device coupled to the electrical bump that is coupled to the bridge-die bond pad; a mid-level interconnect on a surface of the semiconductor package substrate, wherein the mid-level interconnect contacts a tapered via; an interposer coupled to the mid-level interconnect; and a board coupled to the interposer, wherein the board includes an external shell.

In Example 19, the subject matter of Example 18 optionally includes wherein the bridge die is coupled to a chipset.

In Example 20, the subject matter of any one or more of Examples 18-19 optionally include wherein the subsequent die is a graphics processor, further including a fourth die also coupled to the bridge die, wherein the first die and the fourth die are logic processors.

Example 21 is a semiconductor package apparatus, comprising: a bridge die disposed in a recess of a semiconductor package substrate, wherein the semiconductor package substrate includes filled via characteristic of laser drilling coupled to a package pillar characteristic of photolighographic patterning; at least one through-silicon via (TSV) that communicates through the bridge die to couple with at least one of a trace and a bond pad within the semiconductor package substrate; a lamination above the package pillar and the bridge die, wherein the bridge die includes a bridge-die bond pad; an electrical bump that is coupled to the package pillar and an electrical bump that is coupled to the bridge-die bond pad; a first semiconductive device coupled to the electrical bump that is coupled to the package pillar; and a subsequent semiconductive device coupled to the electrical bump that is coupled to the bridge-die bond pad.

In Example 22, the subject matter of Example 21 optionally includes wherein the at least one TSV is coupled to one selected from a trace and a bond pad in the semiconductor package substrate.

In Example 23, the subject matter of any one or more of Examples 21-22 optionally include a fourth die, wherein the first die, the subsequent die and the fourth die each is coupled to the bridge die.

Example 24 is a semiconductor package apparatus, comprising: a bridge die disposed in a recess of a semiconductor package substrate, wherein the semiconductor package substrate includes filled via characteristic of laser drilling coupled to a package pillar characteristic of photolighographic patterning; a planarized lamination above the package pillar and the bridge die, wherein the bridge die includes a bridge-die bond pad; a planarized electrical bump that is coupled to the package pillar and a planarized electrical bump that is coupled to the bridge-die bond pad; a first semiconductive device coupled to the planarized electrical bump that is coupled to the package pillar; a subsequent semiconductive device coupled to the planarized electrical bump that is coupled to the bridge-die bond pad; a package bond pad patterned on the planarized lamination and contacting the package pillar; a bridge-die bond pad patterned on the planarized lamination and contacting a bridge-die pillar; and a package-to-bridge trace patterned on the planarized lamination and contacting a bridge-die pillar and a package pillar.

In Example 25, the subject matter of Example 24 optionally includes wherein the bridge die is seated on an adhesive, further including: a through-silicon via (TSV) that communicates through the bridge die; an electrical bump that couples the TSV to at least one of a trace and a bond pad within the semiconductor package substrate and wherein the package bond pad and the bridge-die bond pad exhibit planarization above the patterned photoresist.

Example 26 is a semiconductor package apparatus, comprising: a bridge die disposed in a recess of a semiconductor package substrate, wherein the semiconductor package substrate includes filled via characteristic of laser drilling coupled to a package pillar characteristic of photolighographic patterning; a planarized lamination above the package pillar and the bridge die, wherein the bridge die includes a bridge-die bond pad; a planarized electrical bump that is coupled to the package pillar and a planarized electrical bump that is coupled to the bridge-die bond pad; a first semiconductive device coupled to the planarized electrical bump that is coupled to the package pillar; and a subsequent semiconductive device coupled to the planarized electrical bump that is coupled to the bridge-die bond pad.

In Example 27, the subject matter of Example 26 optionally includes a package bond pad patterned on the planarized lamination and contacting the package pillar; a bridge-die bond pad patterned on the planarized lamination and contacting a bridge-die pillar; and a package-to-bridge trace patterned on the planarized lamination and contacting a bridge-die pillar and a package pillar.

In Example 28, the subject matter of any one or more of Examples 26-27 optionally include a package bond pad patterned on the planarized lamination and contacting the package pillar; a bridge-die bond pad patterned on the planarized lamination and contacting a bridge-die pillar; a package-to-bridge trace patterned on the planarized lamination and contacting a bridge-die pillar and a package pillar; and a protective contact film disposed on each of the package bond pad and the bridge-to-die bond pad and patterned through a patterned photoresist layer.

In Example 29, the subject matter of any one or more of Examples 26-28 optionally include a package bond pad patterned on the planarized lamination and contacting the package pillar; a bridge-die bond pad patterned on the planarized lamination and contacting a bridge-die pillar; and a package-to-bridge trace patterned on the planarized lamination and contacting a bridge-die pillar and a package pillar, wherein the bridge die is seated on an adhesive, and wherein the package bond pad and the bridge-die bond pad exhibit planarization above the patterned photoresist.

In Example 30, the subject matter of any one or more of Examples 26-29 optionally include wherein the bridge die is seated on an adhesive, and wherein the package bond pad and the bridge-die bond pad exhibit planarization above the patterned photoresist.

In Example 31, the subject matter of any one or more of Examples 26-30 optionally include wherein the bridge die is seated on an adhesive, and wherein the package bond pad and the bridge-die bond pad exhibit planarization above the patterned photoresist, further including a mid-level interconnect on the back surface, wherein the mid-level interconnect contacts a tapered via within the semiconductor package substrate.

In Example 32, the subject matter of any one or more of Examples 26-31 optionally include wherein the semiconductor package substrate includes a back surface, further including: a mid-level interconnect on the back surface, wherein the mid-level interconnect contacts a tapered via within the semiconductor package substrate.

In Example 33, the subject matter of any one or more of Examples 26-32 optionally include wherein the semiconductor package substrate includes a back surface, further including: a mid-level interconnect on the back surface, wherein the mid-level interconnect contacts a tapered via; and an interposer coupled to the mid-level interconnect.

In Example 34, the subject matter of any one or more of Examples 26-33 optionally include wherein the semiconductor package substrate includes a back surface, further including: a mid-level interconnect on the back surface, wherein the mid-level interconnect contacts a tapered via; an interposer coupled to the mid-level interconnect; a ball-grid array on the interposer; and a board coupled to the ball-grid array.

In Example 35, the subject matter of any one or more of Examples 26-34 optionally include wherein the semiconductor package substrate includes a back surface, further including: a mid-level interconnect on the back surface, wherein the mid-level interconnect contacts a tapered via, and wherein the semiconductor package substrate includes a first tapered via, a second tapered via, a third tapered via and a fourth tapered via and a first trace, a second trace, a third trace and a fourth trace, wherein each tapered via ordinally contacts a trace, and wherein the fourth trace is disposed at the planarized lamination, and wherein the fourth trace contacts the package pillar one of the fourth tapered via.

In Example 36, the subject matter of any one or more of Examples 26-35 optionally include a fourth die, wherein the first die, the subsequent die and the fourth die each is coupled to the bridge die.

In Example 37, the subject matter of any one or more of Examples 26-36 optionally include wherein the semiconductor package substrate includes four tapered vias that ordinally contact four respective ordinally sequenced traces, and wherein the fourth trace also contacts a package pillar.

Example 38 is a computing system, comprising: a bridge die disposed in a recess of a semiconductor package substrate, wherein the semiconductor package substrate includes filled via characteristic of laser drilling coupled to a package pillar characteristic of photolighographic patterning; a planarized lamination above the package pillar and the bridge die, wherein the bridge die includes a bridge-die bond pad; a planarized electrical bump coupled to the package pillar and a planarized electrical bump that is coupled to the bridge-die bond pad; a first semiconductive device coupled to the planarized electrical bump coupled to the package pillar; a subsequent semiconductive device coupled to the planarized electrical bump that is coupled to the bridge-die bond pad; a mid-level interconnect on a surface of the semiconductor package substrate, wherein the mid-level interconnect contacts a tapered via; an interposer coupled to the mid-level interconnect; and a board coupled to the interposer, wherein the board includes an external shell.

In Example 39, the subject matter of Example 38 optionally includes wherein the bridge die is coupled to a chipset.

In Example 40, the subject matter of any one or more of Examples 38-39 optionally include wherein the subsequent die is a graphics processor, further including a fourth die also coupled to the bridge die, wherein the first die and the fourth die are logic processors.

Example 41 is a semiconductor package apparatus, comprising: a bridge die disposed in a recess of a semiconductor package substrate, wherein the semiconductor package substrate includes filled via characteristic of laser drilling coupled to a package pillar characteristic of photolighographic patterning; at least one through-silicon via (TSV) that communicates through the bridge die to couple with at least one of a trace and a bond pad within the semiconductor package substrate.

In Example 42, the subject matter of Example 41 optionally includes wherein the at least one TSV is coupled to one selected from a trace and a bond pad in the semiconductor package substrate.

In Example 43, the subject matter of any one or more of Examples 41-42 optionally include a fourth die, wherein the first die, the subsequent die and the fourth die each is coupled to the bridge die.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Connections within disclosed embodiments may be described as "coupled" and "contacting" or the like, where "coupled" means electrical or thermal communication is between the two named structures, and "contacting" or "contacts" means the two named structures physically touch. Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A computing system, comprising:
    a bridge die in a recess of a semiconductor package substrate, wherein the semiconductor package substrate includes a frusto-conical filled via coupled to a right-cylindrical package pillar;
    an encapsulation material contacting the bridge die and the recess;
    an adhesive contacting the bridge die and the recess;
    a layer above the right-cylindrical package pillar and the bridge die, wherein the bridge die includes a bridge-die bond pad;
    an electrical bump coupled to the right-cylindrical package pillar and an electrical bump that is coupled to the bridge-die bond pad;
    a first semiconductive device coupled to the electrical bump coupled to the right-cylindrical package pillar;
    a second semiconductive device coupled to the electrical bump that is coupled to the bridge-die bond pad;
    a third semiconductive device coupled to the bridge die, wherein the third semiconductive device is adjacent the first and second semiconductive devices;
    a mid-level interconnect on a back surface of the semiconductor package substrate, wherein the mid-level interconnect contacts a tapered via;
    an interposer coupled to the mid-level interconnect; and
    a board coupled to the interposer.

2. The computing system of claim 1, wherein the frusto-conical filled via is a laser drilled via.

3. The computing system of claim 1, wherein the right-cylindrical package pillar is a photolighographic patterned pillar.

4. The computing system of claim 1, wherein the frusto-conical filled via is a laser drilled via, and the right-cylindrical package pillar is a photolighographic patterned pillar.

5. The computing system of claim 1, wherein the adhesive is further contacting the encapsulation material.

6. The computing system of claim 1, wherein the bridge die is coupled to a chipset.

7. The computing system of claim 1, wherein the second semiconductive device is a graphics processor, and wherein the first semiconductive device and the third semiconductive device are logic processors.

8. A semiconductor package apparatus, comprising:
    a bridge die in a recess of a semiconductor package substrate, wherein the semiconductor package substrate includes a frusto-conical filled via coupled to a right-cylindrical package pillar;
    at least one through-silicon via (TSV) that communicates through the bridge die to couple with at least one of a trace and a bond pad within the semiconductor package substrate;
    a layer above the package pillar and the bridge die, wherein the bridge die includes a bridge-die bond pad;
    an encapsulation material contacting the bridge die and the recess;
    an adhesive contacting the bridge die and the recess;
    an electrical bump that is coupled to the package pillar and an electrical bump that is coupled to the bridge-die bond pad;
    a first semiconductive device coupled to the electrical bump that is coupled to the package pillar; and
    a second semiconductive device coupled to the electrical bump that is coupled to the bridge-die bond pad.

9. The semiconductor package apparatus of claim 8, wherein the frusto-conical filled via is a laser drilled via.

10. The semiconductor package apparatus of claim 8, wherein the right-cylindrical package pillar is a photolighographic patterned pillar.

11. The semiconductor package apparatus of claim 8, wherein the frusto-conical filled via is a laser drilled via, and the right-cylindrical package pillar is a photolighographic patterned pillar.

12. The semiconductor package apparatus of claim 8, wherein the adhesive is further contacting the encapsulation material.

13. The semiconductor package of claim 8, wherein the at least one TSV is coupled to one selected from a trace and a bond pad in the semiconductor package substrate.

14. The semiconductor package of claim 8, further including a third semiconductive device, wherein the first semiconductive device, the second semiconductive device and the third semiconductive device each is coupled to the bridge die.

15. A computing system, comprising:
    a bridge die in a recess of a semiconductor package substrate, wherein the semiconductor package substrate includes a frusto-conical filled via coupled to a right-cylindrical package pillar;
    at least one through-silicon via (TSV) that communicates through the bridge die to couple with at least one of a trace and a bond pad within the semiconductor package substrate;
    a layer above the package pillar and the bridge die, wherein the bridge die includes a bridge-die bond pad;
    an encapsulation material contacting the bridge die and the recess;
    an adhesive contacting the bridge die and the recess;
    an electrical bump that is coupled to the package pillar and an electrical bump that is coupled to the bridge-die bond pad;
    a first semiconductive device coupled to the electrical bump that is coupled to the package pillar;

a second semiconductive device coupled to the electrical bump that is coupled to the bridge-die bond pad;

a mid-level interconnect on a back surface of the semiconductor package substrate, wherein the mid-level interconnect contacts a tapered via;

an interposer coupled to the mid-level interconnect; and a board coupled to the interposer.

16. The computing system of claim 15, wherein the at least one TSV is coupled to one selected from a trace and a bond pad in the semiconductor package substrate.

17. The computing system of claim 15, further including a third semiconductive device, wherein the first semiconductive device, the second semiconductive device and the third semiconductive device each is coupled to the bridge die.

18. The computing system of claim 15, wherein the frusto-conical filled via is a laser drilled via.

19. The computing system of claim 15, wherein the right-cylindrical package pillar is a photolighographic patterned pillar.

20. The computing system of claim 15, wherein the adhesive is further contacting the encapsulation material.

\* \* \* \* \*